United States Patent [19]
Vander Voorde

[11] Patent Number: 6,031,420
[45] Date of Patent: Feb. 29, 2000

[54] OPERATIONAL AMPLIFIER ARRANGEMENT

[75] Inventor: Lucas Emiel Elie Vander Voorde, Willebroek, Belgium

[73] Assignee: Alcatel, Paris, France

[21] Appl. No.: 09/209,443

[22] Filed: Dec. 11, 1998

[30] Foreign Application Priority Data

Dec. 16, 1997 [EP] European Pat. Off. .............. 97403084

[51] Int. Cl.[7] ...................................................... G06G 7/10
[52] U.S. Cl. .................................. 330/9; 330/51; 330/69; 330/107; 330/109
[58] Field of Search .................................. 330/9, 51, 69, 330/107, 109

[56] References Cited

U.S. PATENT DOCUMENTS

| 4,786,863 | 11/1988 | Milkovic ...................................... | 330/9 |
| 5,124,663 | 6/1992 | McEntarfer et al. ....................... | 330/9 |
| 5,563,587 | 10/1996 | Harjani ................................. | 340/870.3 |

OTHER PUBLICATIONS

P. Havas: "Philips' Application Note 78: Compensation of Transducer Zero Error" Dec. 1969, N.V. Philips', Gloeilampenfabrieken, Eindhoven the Netherlands.

Paul R. Gray et al, "MOS Operational Amplifier Design—A Tutorial Overview", IEEE Journal of Solid–State Circuits, vol. SC–17, Nr 6, Dec. 1982, pp. 969.982.

Primary Examiner—Michael B Shingleton
Attorney, Agent, or Firm—Sughrue, Mion, Zinn, Macpeak & Seas, PLLC

[57] ABSTRACT

An operational amplifier arrangement includes besides the two-stage operational amplifier, a third stage for tracking and holding the input offset of the first stage during an offset compensation phase which regularly interrupts the normal operation of the arrangement. To this purpose four switches are clocked, whereby the first stage is decoupled from the second stage during an offset compensation phase, whereby the feedback loop of the third stage is interrupted during normal mode, and whereby during the offset compensation phase the input is decoupled from the arrangement, while both input terminals are shorted. A Miller capacitor across the second stage prevents the output from drifting during the offset compensation mode.

11 Claims, 2 Drawing Sheets

OPERATIONAL AMPLIFIER ARRANGEMENT

BACKGROUND OF THE INVENTION

The present invention relates to an operational amplifier arrangement as is described in the preamble of claim 1.

Such an operational amplifier arrangement is already known in the art, e.g. from the article "MOS Operational Amplifier Design—A Tutorial Overview", written by Paul R. Gray, and Robert G. Meyer, IEEE Journal of Solid-State Circuits, Vol. SC-17, Nr 6, December 1982, pp 969–982. Therein, on p 971, a schematic of a basic two-stage CMOS operational amplifier is depicted in FIG. 4. This figure corresponds to the configuration described in the non-characteristic part of claim 1. Indeed, the differential input pair formed by transistors M1 and M2, having as resistive loads respective transistors M3 and M4, together with the bias stage consisting of transistors M5 and M8 as well as the current source Ibias, constitute the first operational amplifier of the non-characteristic part of claim 1, whereas the inverter output stage formed by transistors M6 and M7 constitutes the second operational amplifier of the non-characteristic part of claim 1. The DC reference voltage of the second operational amplifier referred to in the non-characteristic part of claim 1 is equal to the DC voltage required on the gate of the transistor M6, in order to sink the DC current delivered by transistor M7 for a drain-source voltage equal to half the value of the dynamic range of the input stage, for the cited prior art. The capacitor in the referenced prior art figure corresponds to the compensation capacitor as described in the non-characteristic part of claim 1, coupled between the output of the arrangement and the output of the first operational amplifier stage.

Such an operational amplifier arrangement has the advantage of having a low output impedance and a high drive capability, dependent on the specific circuitry used for realising both amplifiers. Yet this arrangement suffers from offset problems, since an offset due to for instance mismatch in the differential input pair of the first operational amplifier, will appear at the output of this arrangement multiplied with the total gain of the arrangement. This is intolerable when this arrangement is used for performing precision measurements of very small input signals.

SUMMARY OF THE INVENTION

An object of the present invention is to provide an operational amplifier arrangement of the above known type but whereby the mentioned prior art offset problem is seriously reduced.

According to the invention, this object is achieved due to the fact that said operational amplifier arrangement is further adapted as described in the characteristic part of claim 1.

In this way, the first stage can be decoupled from the second stage by the presence of the first switch. During such a decoupling or offset compensation period, both inputs of the first operational amplifier are shorted by closing a second switch after decoupling the input signal from the operational amplifier. At the same time the output of the first operational amplifier is coupled to the input of a third operational amplifier via a unity feedback loop including a third switch, which is closed during this offset compensation period. Furthermore the compensation capacitance across the second amplifier, assures the output of the total arrangement not to vary with respect to the previous normal mode. At the same time, the first amplifier input offset voltage is added to the output voltage of the third amplifier, while because of the feedback, the output of the third amplifier is also dependent on the offset of the first amplifier. When, in a second period, corresponding to the normal operation mode of the arrangement, the second stage is again coupled to the first stage, while the first amplifier works again in normal mode by opening the second switch and re-coupling the input signal to the input terminal of the first operational amplifier, and while the feedback loop of the third stage is broken by the opening of the third switch, the offset as appearing at the output of the first amplifier is now reduced by a factor almost equal to the open loop gain of this third amplifier, as will be explained extensively in a further paragraph. This is thanks to the presence of a hold capacitor at the input of the third amplifier, which holds the input voltage of this third amplifier at the value it had during the previous offset compensation mode.

Another characteristic feature of the present invention is that said DC voltage and said DC reference voltage are selected according to claim 2.

In this way no systematic error as might occur due to a difference between both DC voltages will be present in the circuit, assuring a better behaviour of the total arrangement.

Yet a further characteristic feature of the present invention is explained in claim 3.

Therefore, as already explained in a previous paragraph, the magnitude of the open loop gain of the third operational amplifier determines the amount of the obtained offset reduction for offset present at the input of the first stage. Alternatively, for a given offset at the input of the first stage, and for a first maximum target for this value, a first boundary condition for the open loop gain of the third operational amplifier is provided.

Another characteristic feature of the present invention is mentioned in claim 4.

It is indeed evident that the offset can only be compensated, as long as its influence on the voltage at the junction point is smaller than the influence of the normal differential input voltage at the input of the third operational amplifier. This is summarised by claim 4, at the same time constituting a second boundary condition for the open loop gains of the first and third operational amplifiers.

Still a further characteristic feature of the present invention is explained in claim 5.

This presents another boundary condition, related to the product of the open loop gain of the first operational amplifier and the third operational amplifier. When this condition is fulfilled, two other equivalent input offset components, a first one due to the inherent offset of the third operational amplifier, a second one due to the finite gain of the third operational amplifier, are avoided.

Yet a further characteristic feature of the present invention is described in claim 6.

For the third switch consisting of a first Metal-Oxide-Semiconductor, hereafter abbreviated by MOS transistor with an inherent MOS capacitance, effects such as charge redistribution due to clockfeedthrough as well as leakage in the source or drain terminals, may lead to an extra equivalent offset component, of which the equivalent input value again has to be lower than the a third target maximum offset value, to guarantee a correct offset reduction.

Another characteristic feature of the present invention is stated in claim 7.

Similarly, for a second MOS transistor constituting the first switch, the same considerations with respect to leakage and to clockfeedthrough can be made. A difference with respect to the third switch is that the first switch is coupled to a compensation capacitor in a feedback loop across the second operational amplifier, and that therefore part of the parasitic effects are also appearing at the output of the complete arrangement.

Yet another characteristic feature of the present invention is described in claim 8.

In this way, the sum of all individual offset contributions is limited by one predetermined absolute maximum target input offset value, in order to guarantee an appropriate offset reduction and consequently a proper functioning of the arrangement.

Another characteristic feature of the present invention is described in claim 9.

Indeed, for embodiments of the arrangement including non-ideal second and third switches, care needs to be taken in order to first short the input of the first amplifier, before connecting the first amplifier output terminal to the hold capacitor. This is to have as less as possible unwanted swing at the hold capacitor which acts as an offset storing capacitor during the offset compensation phase. Therefore, in stead of one inverted clock signal, a first inverted and a second inverted clock signal are generated by the clock generation means, characterised by some predetermined delays with respect to each other, such that the above mentioned considerations for opening and closing of the second and third switches apply.

A further characteristic feature of the present invention is described in claim 10.

Similarly, in case of non-ideal first and fourth switches the second operational amplifier stage is first to be decoupled, before the input signal may be decoupled from the inputs of the first operational amplifier. This is important since during the offset compensation phase the voltage at the output is desired to be as near as possible to the latest normal output voltage. In case the first operational amplifier is decoupled and subsequently shorted, while the second stage is still coupled to the first, the output of the complete arrangement could be driven far from its normal output voltage. Therefore a first and a second clock signal are generated by the clock generation means such that the fourth and first switches are opened and closed with some predetermined delays with respect to each other.

Yet another characteristic feature of the present invention is described in claim 11.

To avoid disturbing the input signal when disconnecting it from the input, while at the same time shorting the inputs of the first operational amplifier, some delay is added between the act of disconnecting the input signal from the input terminal and the act of shorting both input terminals. This is realised by adapting the clock generation circuit such that the second clock signal and the first inverted clock signal are not longer merely inverted signals, but inverted signals of which the rising and falling edges are shifted with respect to each other by a fifth predetermined delay time, between closing the second and opening the fourth switch and by a sixth predetermined delay time between opening the second and closing the fourth switch.

BRIEF DESCRIPTION OF THE DRAWING

The above and other objects and features of the invention will become more apparent and the invention itself will be best understood by referring to the following description of an embodiment taken in conjunction with the accompanying drawings wherein FIG. 1 schematically depicts an operational amplifier arrangement according to the invention, FIG. 2 schematically depicts the different clock input signals acting as control signals for the different switches for one embodiment of the arrangement of FIG. 1.

DETAILED DESCRIPTION OF THE INVENTION

Figure 1:
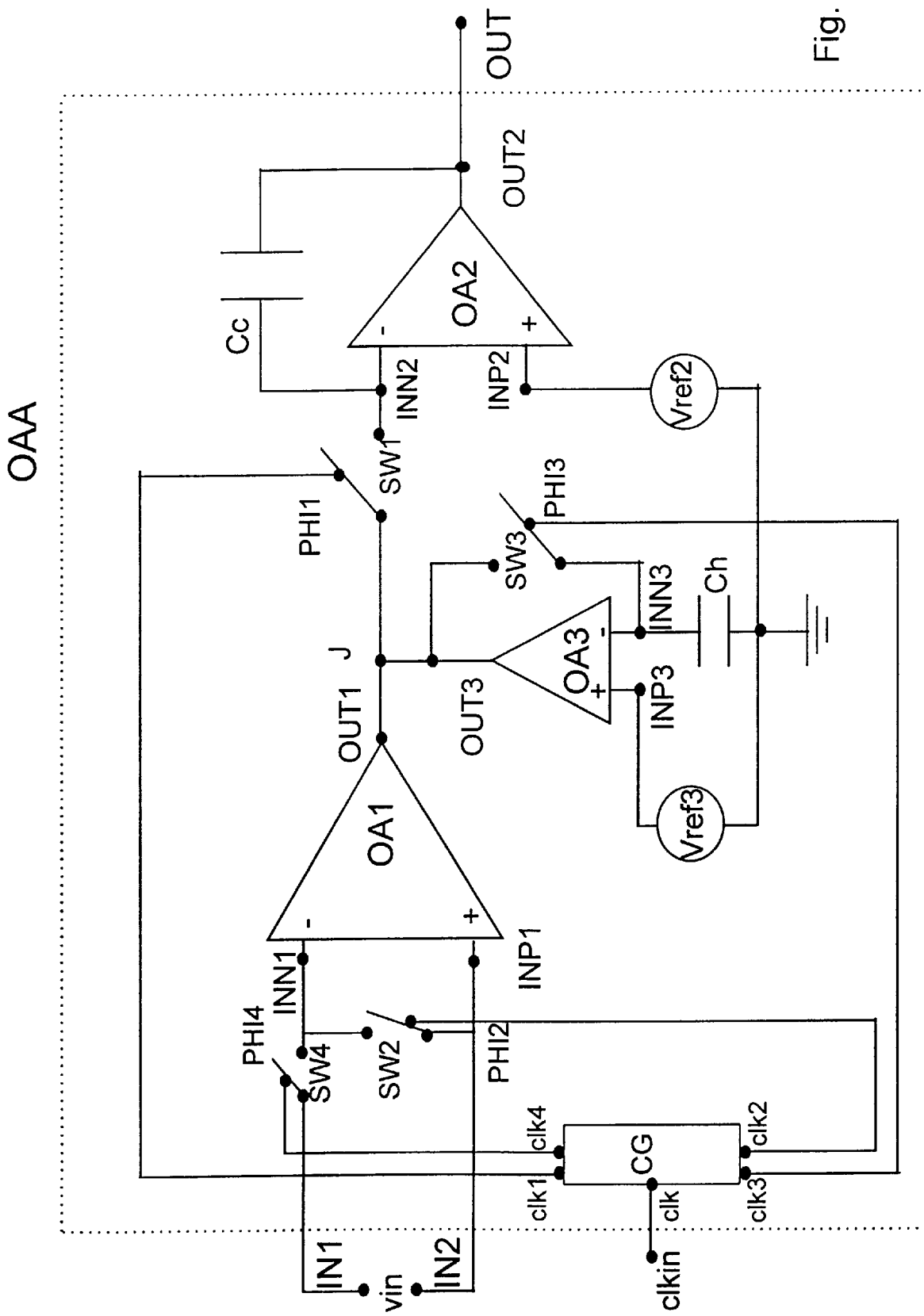

The operational amplifier arrangement as shown in FIG. 1 is for instance used for precision measurements, such as needed for automotive and telecommunications applications. In one automotive application, the arrangement is used to measure small voltage differences across sense resistors, this measurement thereby being very susceptible to offset of the operational amplifier to which the measured input signal is applied.

The operational amplifier arrangement of the invention, as depicted in FIG. 1, basically consists of the well-known two-stage operational amplifier, extensively described in various publications such as in for instance the already referenced prior art article of P. Gray. Basically such a two-stage configuration consists of a pre-amplifier stage, in FIG. 1 referred to as the first operational amplifier OA1, having a first input terminal, denoted INN1, and a second input terminal, denoted INP1. In the figure INN1 is of a negative polarity type, whereas INP1 is of a positive polarity type. However, in other embodiments both types can be interchanged. The first input terminal INN1 of this first operational amplifier is coupled to the first arrangement input terminal, denoted IN1, whereas the second input terminal INP1 of this first operational amplifier is coupled to the second arrangement input terminal, denoted IN2. Between both arrangement input terminals IN1 and IN2, a differential input signal, denoted by vin, is applied. The first operational amplifier OA1 further has a first amplifier output terminal, denoted OUT1, which is coupled to a second amplifier negative input terminal INN2 of a second operational amplifier OA2. This second operational amplifier OA2 further has a second amplifier positive input terminal denoted INP2, and to which a DC voltage denoted as Vref2 is applied. A compensation feedback capacitor, also commonly known as a Miller capacitor and denoted with Cc on FIG. 1 is coupled between the second amplifier output terminal OUT2 of the second operational amplifier, and the second amplifier negative input terminal denoted INN2. The second amplifier output terminal OUT2 is coupled to the arrangement output terminal denoted OUT.

In addition to this commonly known two-stage amplifier configuration, the operational amplifier arrangement OAA further includes a third operational amplifier, denoted by OA3. This third operational amplifier OA3 has a third amplifier positive input terminal, denoted INP3, to which another DC voltage, denoted Vref3 is applied. This third operational amplifier further includes a third amplifier negative input terminal, denoted INN3, which is coupled via a hold capacitor, denoted Ch, to the ground potential. A third amplifier output terminal, denoted OUT3 is coupled to the first amplifier output terminal OUT1 of the first operational amplifier OA1 at a common junction point, denoted J.

Furthermore the subject operational amplifier arrangement includes four switches, respectively denoted SW1, SW2, SW3 and SW4. The series terminals of the first switch SW1 are coupled between the second amplifier negative input terminal INN2 and the junction point J. The series terminals of the second switch SW2 are coupled between the two input terminals INN1 and INP1 of the first operational amplifier OA1. The series terminals of the third switch SW3 are coupled between the third amplifier output terminal OUT3 and the third amplifier negative input terminal INN3. Finally the series terminals of the fourth switch SW4 are coupled between the first arrangement input terminal IN1 and the first input terminal INN1 of the first operational amplifier OA1.

These four respective switches SW1 to SW4 are respectively controlled by means of four clock signals, in FIG. 1 denoted by PHI1,PHI2,PHI3 and PHI4. These four clock signals are generated by means of a clock generation means, denoted CG, which includes a clock input terminal clk, coupled to an arrangement clock input terminal clkin of the operational amplifier arrangement and to which an input clock signal, also commonly known as a master clock, is applied. The clock generation means CG is adapted to generate four appropriate respective clock signals PHI1, PHI2,PHI3 and PHI4, and to deliver them respectively to four respective output terminals of CG, denoted clk1, clk2, clk3 and clk4.

The operation of the arrangement will now first be explained in case of an embodiment including ideal switches, meaning switches which open and close without delay and where no parasitic effects such as leakage at series terminals, or charge redistribution etc. are involved. In a later paragraph of this document, another embodiment including Metal Oxide Semiconductor, hereafter abbreviated at MOS, transistors as switches, will be described.

In the case of four ideal switches, only two inverted clock signals are needed for a proper operation of the operational amplifier arrangement. In this case PHI1 equals PHI4, PHI2 equals PHI3, whereas PHI1 is the inverted signal of PHI2 and vice-versa. This means that PHIL and PHI2 are oppositely controlling the switches to which they are applied: if PHI2 is closing a switch to which it is applied, such as SW2, at the same time the switch at which PHI1 is simultaneously applied, such as SW1 is open, and vice versa.

For this case, the clock generation means only has to generate two opposite clocks from the input or master clock signal, whereby PHI1 corresponds to the clock signal of CG delivered at a clock output of CG, in FIG. 1 constituted by the first clock output terminal clk1 and the second clock output terminal clk4. PHI2 is the inverted clock signal of CG, delivered at the inverted clock output of CG, in FIG. 1 constituted by the first inverted clock output terminal clk2, and the second inverted clock output terminal clk3.

Two phases, related to the different clock phases, of the two inverse clock signals, are to be discriminated during the operation of the arrangement. During a first phase, also called the offset compensation phase, the second switch SW2 and the third switch SW3 are closed, whereas SW4 and SW1 are open. By closing the second switch, the only input signal appearing at OA1, is its inherent offset, denoted Voff.

The voltage Vj at the junction point J is the sum of the output voltage delivered by the first operational amplifier, and the output voltage delivered by the third operational amplifier. The output voltage delivered by the first operational amplifier is given as minus the product of its open loop gain A1 and its inherent offset Voff. The output voltage delivered by the third operational amplifier, in this mode, is equal to the product of its respective open loop gain A3, and the difference between the voltages applied at its positive input terminal, being Vref3, and its negative input terminal, being Vj. Remark that in a first approximation, the inherent offset of OA3 is neglected.

The voltage at Vj during this mode, denoted Vjoc, is thus given by formula (1)

$$Vjoc = -(A1 \cdot Voff) + A3 \cdot (Vref3 - Vjoc) \tag{1}$$

which can be re-calculated as $$Vjoc = \frac{(A3 \cdot Vref3 - A1 \cdot Voff)}{(1 + A3)} \tag{2}$$

During the second phase of the operation of the arrangement, also called the normal mode, the second switch SW2 and the third switch SW3 are open, whereas the first switch SW1 and the second switch SW4 are closed. Thanks to the hold capacitor Ch, the voltage at the third amplifier negative input terminal INN3 remains at the Vjoc voltage of the previous phase, as was given by formula (2).

The voltage at the junction point J during the normal mode, denoted Vjn, now becomes:

$$Vjn = -(Vin + Voff)A1 + A3 \cdot (Vref3 - Vjoc) \tag{3}$$

or, when replacing Vjoc by the second term of formula (2), $$Vjn = -A1 \cdot Vin + \frac{A3 \cdot Vref3}{1 + A3} - \frac{Voff \cdot A1}{1 + A3}. \tag{4}$$

From formula (4) it is observed that the first term is the desired one, and that the influence of the offset of the first amplifier can be reduced by selecting the third amplifier open loop gain A3 to be sufficiently large, reducing the influence of the offset at the input of the first amplifier with a factor (1+A3), compared to a non-compensated operational amplifier. For a first target offset reduction, obtained as a first target ratio Voff/Voffmax1, with Voffmax1 representing an first target maximum input offset value of the non-compensated circuit, and Voff representing the normally appearing offset at the arrangement input, this means that $$A3 + 1 \geq Voff/Voffmax1 \tag{5}$$

Formula (5) presents a first boundary condition to which the open loop gain A3 of the third operational amplifier has to comply with.

It needs to be remarked, as can also be deduced from formula (1) that the offset can only be compensated as long as the term "A1. Voffset" is lower in absolute value than the term "A3.(Vref3−Vj)". The latter term is limited by the maximum differential input voltage swing of the third operational amplifier, which is itself related to its dynamic range. For Vinmax3 representing this maximum differential input voltage swing, the following formula applies:

$$Voff \cdot A1 < A3 \cdot Vinmax3 \tag{6}$$

representing another boundary condition for the open loop gains A1 and A3 of the first and third operational amplifier, if a proper operation of the arrangement is to be guaranteed.

Formula (4) further shows that during the normal mode, the voltage delivered by the third amplifier at the junction point J, is not equal to Vref3 as would be expected, but slightly deviates from this value by the factor A3/(1+A3). This effect, due to the finite gain A3 of the third operational amplifier, can as well be considered as an extra systematic equivalent offset contribution, which, if calculated back to the input of OA1, has an equivalent offset value given by $$V_{offsys} = -\left(Vref3 - \frac{A3 \cdot Vref3}{1 + A3}\right) \cdot \frac{1}{A1} \quad (7)$$

For this value also not exceeding a second target maximum input offset Voffmax2, $$(A3 + 1) \cdot A1 \geq \frac{Vref3}{Voffmax2} \quad (8)$$

Therefore, the larger the DC reference voltage Vref3, the larger the product of the open loop gain A1 and 1+the open loop gain A3, has to be, in order to reduce this effect.

During the previous calculations, the influence of the inherent offset Voff3 of the third operational amplifier was not yet taken into account. A person skilled in the art can easily calculate this effect on the voltage at junction point J during normal mode to be equal to Voff3/(A3+1). Calculated back to an equivalent offset at the input of the arrangement, which can also be limited by the second target maximum input offset value Voffmax2, since the first terms in both formula's are identical, one obtains $$(A3 + 1) \cdot A1 \geq \frac{Voff3}{Voffmax2}. \quad (9)$$

In general, either Voff3 or Vref3 will have the largest value, such that by fulfilling the most stringent of both equations, (8) or (9), the other one is fulfilled accordingly. Thus selecting the maximum between both Voff3 and Vref3 and selecting values for A3 or A1 in accordance to the most stringent equation will suffice.

Until now the functional behaviour of the present arrangement was described without considering the second operational amplifier OA2. The function of this output stage is to add extra gain to the complete circuit and to make the output low impedant. The compensation or Miller capacitance Cc, coupled as a feedback capacitor across this second operational amplifier, preserves the output voltage from drifting from the value it has during normal mode, during the opening of the first switch SW1, thus when going to the offset compensation phase. Thereby a proper functioning of the arrangement is guaranteed. This second stage with the compensation capacitor Cc can thus also be considered as a hold stage during the compensation phase.

The value of the DC voltage Vref2 supplied to the second amplifier positive input terminal INP2 is derived from the following considerations During offset compensation mode, when SW1 is open, the relationship between the voltage VINN2, present at the second amplifier negative input terminal INN2, the voltage Vref2 at the second amplifier positive input terminal INP2, and the second amplifier output voltage, denoted Vout2, is given by:

$$Vout2 = A2(Vref2 - VINN2) \quad (10)$$

At the same time, during offset compensation mode, the voltage at the junction point J, thus at the other side of the switch, is given by formula (2), approximating Vref3.

On the other hand, at the instance of closing the switch SW1, the voltage at both sides of the switch should preferably be equal in order to not disturb the output of the arrangement significantly. This means that the voltage at the junction point J, given by formula (2), and approximately equal to Vref3, during the offset compensation mode also has to be equal to VINN2 from formula (10) as expressed by the first term of equation 11:

$$Vref2 - \frac{Vout2}{A2} = -Voff \cdot A1 + Vref3 \cdot \left(\frac{A3}{1 + A3}\right) \quad (11)$$

Only in case when Vref3 is approximately equal to Vref2, no significant transients during the closing of the switch will occur, since in this case the corresponding DC output voltage Vout2, becomes zero, and is kept constant during the switching event.

In case there should exist a difference between both DC voltages Vref2 and Vref3, this difference is again related to an equivalent input offset, which may not exceed a target maximum systematic input offset value Voffsysmax, as given by formula (12):

$$\frac{(Vref2 - Vref3)}{A1} \leq Voffsysmax \quad (12)$$

Until now an arrangement including ideal switches was described. In the next paragraphs an embodiment with MOS transistors as switches will be considered. In this case the series terminals of the switches correspond to the source and drain terminals of the corresponding MOS transistors, and the control terminal of the switch corresponds to the gate terminal of the corresponding MOS transistors.

Such MOS transistors have an inherent MOS gate capacitance, and therefore, part of the charge stored at a capacitor in series with the transistor, such as for instance SW3 in series with Ch and SW1 in series with Cc, will be distributed over itself and over the MOS capacitance of the transistor. This charge-redistribution, mainly occurring during opening or closing of the switch, is commonly known as clockfeedthrough, and is reflected by a voltage drop at respectively unction point J, and the second amplifier negative input terminal INN2. The voltage at the latter terminal INN2 is also influencing the voltage at the output of the arrangement.

Besides clockfeedthrough, another effect related to MOS transistors in series with a capacitor consists of leakage of the charge stored at the capacitor, via the source or drain terminal of the MOS transistor. Both effects, although normally being minor effects, can again be re-calculated as an equivalent maximum input offset, which may not be exceeded, as will be done in the following paragraphs.

For the switch SW3, the effect of the clockfeedthrough on the voltage at the third amplifier negative input terminal INN3, may be expressed as $$\Delta Vcf \propto Vjsw \cdot \frac{Csw3}{Ch + Csw3} \quad (13)$$

whereby ΔVcf represents the clockfeedthrough voltage component, denotes "to be proportional to", Vjsw represents the voltage swing at the gate of the MOS transistor constituting SW3, Ch represents the capacitance value of the hold capacitor and Csw3 represents the gate capacitance of the MOS transistor constituting the third switch SW3.

Integrating the leakage current from the source or drain area of the MOS switch SW3, over the normal operation period, thus when SW3 is open, represents the charge that has leaked away from the hold capacitor Ch. This charge, divided by the hold capacitor itself results in the leakage correction factor, denoted ΔVI (t), to be subtracted from the voltage at INN3 during normal mode.

$$\Delta Vl(t) \propto t \cdot \frac{Isleak}{Ch} \quad (14)$$

whereby again denotes to be proportional to, Isleak represents the source or drain leakage current of the source or drain terminal of the MOS transistor constituting the third switch SW3, and Ch represents the hold capacitor.

A person skilled in the art can now again easily calculate the effect both terms have on formula (4), giving the voltage VJ at junction point J, during normal mode, whereby again boundary conditions can be deduced for the open loop gains A3,A1 with respect to the influence of these terms and related to an equivalent third target maximum offset value Voffmax, as given by formula (15)

$$\frac{A1}{A3} \geq \frac{(\Delta Vcf + \Delta Vl(t))}{Voffmax3} \quad (15)$$

From this formula it can be deduced that these effects are minimized, by increasing the ratio A1/A3. On the other hand, using small MOS transistors, with short gate lengths and widths, these effects are also inherently reduced, since both gate capacitance and source and drain area, directly related to the source and drain leakage currents, seriously decrease by using smaller dimensions.

During the switching from the normal to the offset compensation or hold mode, a small charge, expressed as Qicf, is as well injected in the Miller or compensation capacitance Cc, in series with the first switch SW1. This charge is proportional to the voltage step on the gate of the transistor constituting SW1 and the gate capacitance of this transistor Csw1.

On the other hand some charge leaks away from the compensation capacitor by the source or drain leakage current of the MOS transistor constituting SW1. This charge is denoted as −Qil(t) and is again proportional to the offset compensation time, and the source or drain leakage current.

The sum of both charge components corresponds to the total charge Qi(t) injected into Cc, which itself relates to an equivalent voltage step Vstep(t)=Qi(t)/Cc. By the function of the integrator consisting of the second operational amplifier OA2 and its Miller capacitance Cc, this equivalent voltage step is observed as Vstep(t)/(A2+1) on the input terminal INN2, and as Vstep(t).A2/(1+A2) at the second amplifier output terminal OUT2. A2 thereby represents the open loop gain of the second operational amplifier OA2.

Since the second amplifier output terminal is coupled to the arrangement output terminal OUT, the latter voltage component is also observed at the output of the arrangement.

In the assumption that only the DC error on the output voltage of the total arrangement is of importance, whereby this error is only occurring during the offset compensation mode, the total effect on the output voltage of the arrangement can then be expressed as $$Verror = \frac{Toc}{Tperiod} \cdot \frac{A2}{A2+1} \cdot Vstep \quad (16)$$

with Verror representing the DC error on the output voltage of the arrangement, Toc representing the offset compensation duration, Tperiod representing the total period (offset compensation+normal mode).

For A representing the total gain of the complete arrangement, an equivalent offset can again be calculated from the DC errror voltage, and limited by a fourth target maximum offset as given by formula (17)

$$\left(\frac{Toc}{Tperiod} \cdot \frac{A2}{A2+1}\right) \cdot \frac{1}{A} \leq Voffmax4 \frac{Cc}{Qcf + Qil(t)} \quad (17)$$

Again the influence of clockfeedthrough as well as leakage can be significantly reduced by strongly reducing the dimensions of the MOS transistor constituting SW1.

Formula's (5),(8) and (9),(12),(15) and (17) thus all presented boundary conditions from which the open loop gains, the clock periods, the DC voltages etc. can be selected in order not to exceed equivalent target offset values at the input of the arrangement, respectively being Voffmax1, Voffmax2, Voffsmaxsys, Voffmax3 and Voffmax4. These six formula's correspond to six equivalent offset contribution terms related to the input offset Voff at OA1, a systematical offset due to the limited gain A3 and the offset Voff3 of OA3, the difference between Vref2 and Vref3, and the effects of clockfeedthrough and leakage associated to the non-ideal switches SW3 and SW1. The sum of all of them may not exceed one predetermined absolute maximum target offset value, denoted Voffmax, the value of which is for instance imposed by surrounding systems considerations. A safe and conservative approximation may then consist of adding all upper boundary limits for all six factors together, leading to the second term of the next formula, whereby the obtained sum again may not exceed Voffmax:

Voffmax ≥ Voffmaxsys+Voffmax1+2.Voffmax2+Voffmax3+Voffmax4 and presenting a final covering boundary condition from which the arrangement design parameters can be determined.

In this formula the second target maximum input offset value appears two times, since this represents both an upper limit for the offset contribution due to the offset Voff3 of the third operational amplifier and the offset contribution due to the finite gain of this same operational amplifier OA3.

Final remarks concern the timing, or clocking of the switches. Until now only two opposite clock signals, PHI1 and PHI2, were used. When using MOS transistors as switches, some delays may occur during opening or closing of the switches. Since, as explained during a previous paragraph, this opening or closing can be further accompanied with charge injection, a correct timing is mandatory for having a good offset compensation. Following considerations apply:

during offset compensation, the voltage at the output is desired to be as near as possible to the latest normal output voltage. The second operational amplifier therefore has to be placed in hold, before the input terminals of the first stage are decoupled from the input signal and subsequently shorted. This means that SW1 has to open, before SW4 has to open and SW2 has to close. If not, due to the delay involved when opening or closing the respective switches, the output might be driven far from its normal output voltage.

when switching from normal mode to offset compensation mode, after opening SW1, SW4 is opened, before SW2 is closed. SW3 is closed at last. This is to prevent unwanted voltage swing at the hold capacitor Ch.

At the end of the offset compensation mode the sequence is inverse. First disconnect Ch, next open SW2, close SW4 and finally close SW1.

From this it is evident that no longer two opposite clock signals can be used. An embodiment using four different clocks, as depicted in FIG. 1, with clock signals fulfilling the above described conditions is therefore needed. Since the least critical sequence is the one from SW4 and SW2, an embodiment where PHI2 and PHI4 are opposite or inverted clocks will however still properly function.

Figure 2:
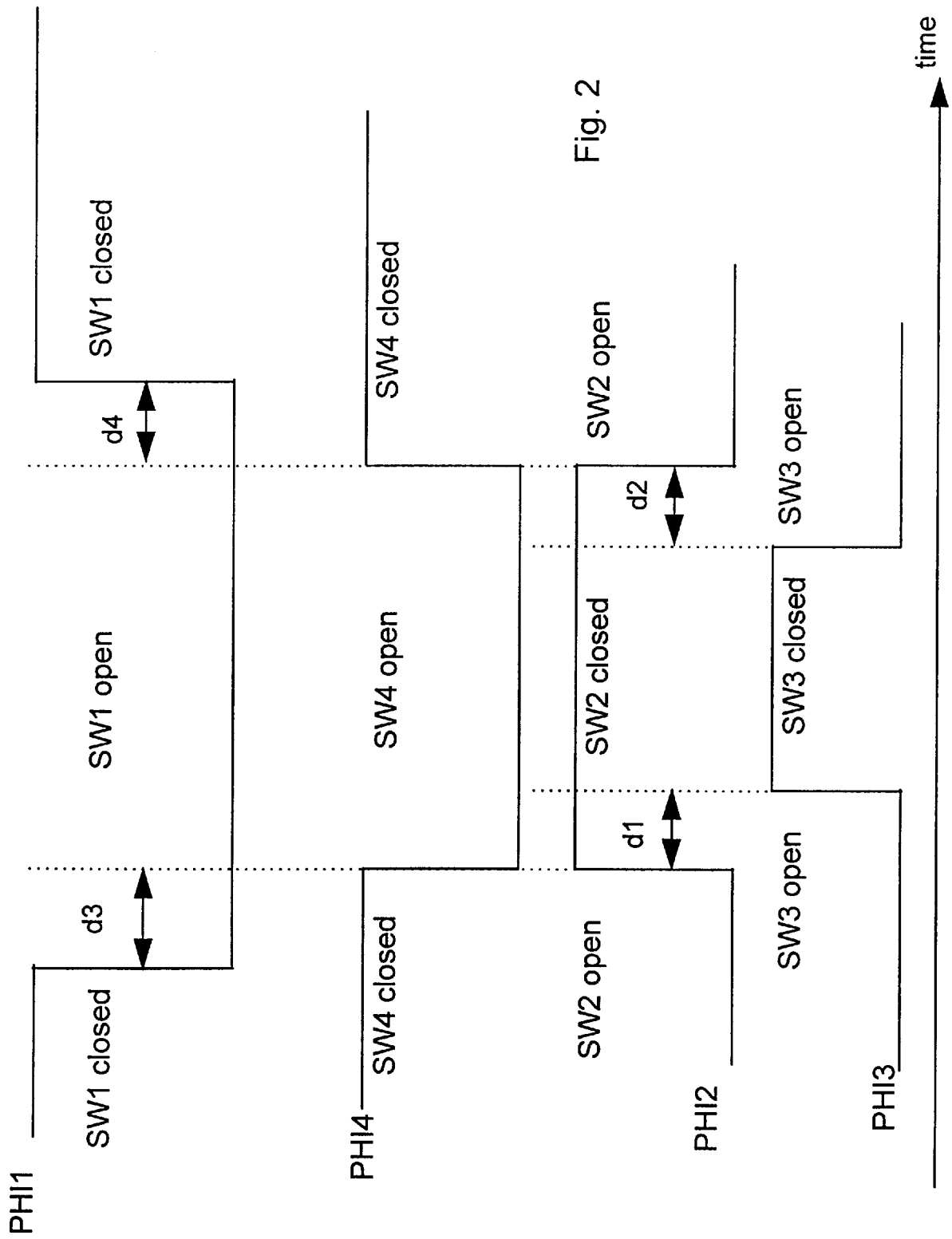

In FIG. 1, the clocks controlling respective switches SW1,SW2,SW3 and SW4 are respectively denoted PHI1, PHI2,PHI3 and PHI4. Their timing behaviour for one embodiment of the arrangement is schematically depicted in FIG. 2, for the case where a switch is closed by a clock signal with a logical "1" value, and or a switch being open by a clock signal having a logical "0". From that figure it is observed that PHI2 and PHI4 are still merely inverted clock signals, that PHI1 first decreases to logical "0", resulting in an opening of switch SW1, before PHI2 is high, simultaneously with PHI4 being low, resulting in opening of SW4 and closing of SW2. The time delay between the opening of SW1 and the closing of SW4 is denoted d3 in FIG. 2. This predetermined time delay depends on the specific embodiments used for the switches SW4 and SW1. For these switches being MOS transistors, this predetermined delay will thus depend the intrinsic switching delay of these transistors, and how these relate to each other. The intrinsic switching delay is thereby influenced by the geometry, the technology used etc., as well as the gate voltage swing, as is commonly known by a person skilled in the art. After another predetermined delay time, denoted d1 in FIG. 2, PHI3 is set high, resulting in a closing of the switch SW3.

When going from offset compensation to normal mode, again delays denoted d2, and d4, respectively between PHI3 with respect to PHI2 and from PHI4 with respect to PHI1 have also to be taken into account, based on already mentioned considerations.

Remark that despite the delays d1 and d2, the second inverted clock signal PHI3 can still be considered to be substantially inverted with respect to for instance PHI4 or even PHI1, whereby is meant that for the majority of the time, these signals are still oppositely controlling the switches to which they are applied. The same remark is valid for PHI1 with respect to PHI2 and even to PHI3.

A person skilled in the art is able to realise an embodiment of the clock generation means CG, for generating the appropriate control clock signals, as depicted in FIG. 2, from one master clock. Similarly, for the even more general case where a fifth delay is needed between the opening of the fourth switch and the closing of the second switch, as well as a sixth delay between the opening of the second switch and the closing of the fourth switch, appropriate circuitry for realising these clock signals is common knowledge. Since these circuits do not form an essential part of the invention, more detailed implementations or embodiments will not be further described.

While the principles of the invention have been described above in connection with specific apparatus, it is to be clearly understood that this description is made only by way of example and not as a limitation on the scope of the invention, as defined in the appended claims.

I claim:

1. Operational amplifier arrangement (OAA) including a first arrangement input terminal (IN1) and a second arrangement input terminal (IN2) between which a differential input voltage (vin) is applied, said operational amplifier arrangement (OAA) further including an arrangement output terminal (OUT) for delivering an output voltage, said operational amplifier arrangement (OAA) further including a first operational amplifier (OA1) having a first input terminal (INN1) of a first polarity type (−) and coupled to said first arrangement input terminal (IN1), said first operational amplifier (OA1) having a second input terminal (INP1) of a second polarity type (+) opposite to said first polarity type, and a first amplifier output terminal (OUT1), a second operational amplifier (OA2) having a second amplifier negative input terminal (INN2) and coupled to said first amplifier output terminal (OUT1) of said first operational amplifier (OA1), said second operational amplifier (OA2) having a second amplifier positive input terminal (INP2) to which a DC voltage (Vref2) is supplied, said second operational amplifier (OA2) further including a second amplifier output terminal (OUT2) coupled to said arrangement output terminal (OUT), and to said second amplifier negative input terminal (INN2) via a compensation capacitor (Cc), characterised in that said operational amplifier arrangement further includes a third operational amplifier (OA3) having a third amplifier negative input terminal (INN3) which is coupled via a hold capacitor (Ch) to the ground potential, said third operational amplifier (OA3) further having a third amplifier positive input terminal (INP3) to which a DC reference voltage (Vref3) is supplied, said third operational amplifier (OA3) further having a third amplifier output terminal (OUT3) coupled to said first amplifier output terminal (OUT1) at a common junction point (J), a clock generation means (CG), including a clock input terminal (clk) coupled to an arrangement clock input terminal (clkin) to which an input clock signal is applied, a clock output and an inverted clock output, said clock generation means (CG) being adapted to generate from said input clock signal, a clock signal for delivery to said clock output, and an inverted clock signal, substantially inverted with respect to said clock signal, for delivery to said inverted clock output, a first switch (SW1) having series terminals respectively coupled to said junction point (J) and to said second amplifier negative input terminal (INN2) respectively, and a first switch control terminal coupled to said clock output of said clock generation means (CG), a second switch (SW2) having series terminals respectively coupled to said first input terminal (INN1) and said second input terminal (INP1) of said first operational amplifier (OA1) respectively, and a second switch control terminal coupled to said inverted clock output of said clock generation means (CG), a third switch (SW3) having series terminals respectively coupled to said third amplifier negative input terminal (INN3) and said third amplifier output terminal (OUT3) respectively, and a third switch control terminal coupled to said inverted clock output of said clock generation means (CG), a fourth switch (SW4) having series terminals respectively coupled to said first arrangement input terminal (IN1) and to said first input terminal (INN1) of said first operational amplifier (OA1) respectively, and a fourth switch control terminal coupled to said clock output of said clock generation means (CG).

2. Operational amplifier arrangement according to claim 1 characterised in that the difference between said DC voltage (Vref2) and said DC reference voltage (Vref3) is smaller than the open loop gain (A1) of said first operational amplifier multiplied with a target maximum systematic input offset value.

3. Operational amplifier arrangement according to claim 1 characterised in that one added to the open loop gain of said third operational amplifier (OA3) is larger than the ratio between the offset at the input of said first operational amplifier (OA1) and a first target maximum input offset value.

4. Operational amplifier arrangement according to claim 3 characterised in that said offset at the input of said first operational amplifier (OA1), multiplied with the open loop gain of said first operational amplifier is lower than said open loop gain of said third operational amplifier (OA3), multiplied with the maximum differential input voltage of said third operational amplifier (OA3).

5. Operational amplifier arrangement according to claim 1 characterised in that one added to said open loop gain of said third operational amplifier (OA3), multiplied with said open loop gain of said first operational amplifier (OA1) and with a second target maximum input offset value, may not be lower than the maximum between said DC reference voltage (Vref3) and a maximum offset value of said third operational amplifier (OA3).

6. Operational amplifier arrangement according to claim 1 characterised in that for a first MOS transistor constituting said third switch (SW3), the ratio between said open loop gain of said first operational amplifier (OA1) and said open loop gain of said third operational amplifier (OA3), multiplied with a third target maximum input offset value may not be lower than the sum of a first voltage drop due to charge redistribution between said first MOS transistor constituting said third switch (SW3) and said hold capacitor (Ch), and a second voltage drop due to leakage at the series terminal of said first MOS transistor coupled to said hold capacitor (Ch).

7. Operational amplifier arrangement according to claim 1 characterised in that the sum of a third voltage drop due to charge redistribution between a second MOS transistor constituting said first switch (SW1) and said Miller capacitor (Cc) and a fourth voltage drop due to leakage at the series terminal of said second MOS transistor and said compensation capacitor (Cc), multiplied with the ratio between the duration during which said first switch is open and the total duration of the period of opening and closing said first switch, multiplied with the ratio between the open loop gain of said second operational amplifier (OA2) and one added to said open loop gain of said second operational amplifier (OA2), and divided by the total gain of said operational amplifier arrangement (OAA), may not exceed a fourth target maximum input offset value.

8. Operational amplifier arrangement according to any of the previous claims 2,4, 5,6 and 7 characterised in that the sum of said target systematic input offset value, said first target maximum input offset value, twice said second target maximum input offset value, said third target maximum input offset value and said fourth target maximum input offset value may not exceed a predetermined absolute maximum target input offset value of said arrangement.

9. Operational amplifier arrangement according to claim 1 characterised in that said inverted clock output of said clock generation means (CG) includes a first inverted clock output terminal (clk2) which is coupled to said second switch control terminal, and a second inverted clock output terminal (clk3) which is coupled to said third switch control terminal, said inverted clock signal thereby consists of a first inverted clock signal (PHI2) and a second inverted clock signal (PHI3), said clock generation means (CG) is thereby adapted to generate from said input clock signal, said first inverted clock signal (PHI2) for delivery to said first inverted clock output terminal (clk2), and said second inverted clock signal (PHI3) for delivery to said second inverted clock output terminal (clk3) whereby said first inverted clock signal (PHI2) is controlling said second switch (SW2) and said second inverted clock signal (PHI3) is controlling said third switch (SW3) such that closing said third switch (SW3) occurs a first predetermined delay time (d1) later than closing said second switch (SW2), and such that opening said second switch (SW2) occurs a second predetermined delay time (d2) later than opening said third switch (SW3).

10. Operational amplifier arrangement according to claim 1 characterised in that said clock output of said clock generation means (CG) includes a first clock output terminal (clk1) which is coupled to said first switch control terminal, and a second clock output terminal (clk4) which is coupled to said fourth switch control terminal, said clock signal thereby consists of a first clock signal (PHI1) and a second clock signal (PHI4), said clock generation means (CG) is thereby adapted to generate from said input clock signal said first clock signal (PHI1) for delivery to said first clock output terminal (clk1) and said second clock signal (PHI4) for delivery to said second clock output terminal (clk4) whereby said first clock signal (PHI1) is controlling said first switch (SW1) and said second clock signal (PHI4) is controlling said fourth switch (SW4) such that opening said fourth switch occurs a third predetermined delay time (d3) later than the opening of said first switch (SW1), and such that closing said first switch occurs a fourth predetermined delay time (d4) later than closing of said fourth switch (SW4).

11. Operational amplifier arrangement according to claims 9 and 10 characterised in that said clock generation means (CG) is further adapted to generate said second clock signal (PHI4) and said first inverted clock signal (PHI2) such that closing of said second switch occurs at a fifth predetermined delay time later than opening of said fourth switch, and such that the closing of said fourth switch (SW4) occurs at a sixth predetermined delay time later than the opening of said second switch (SW2).

\* \* \* \* \*